United States Patent [19]
Fischer et al.

[11] Patent Number: 5,847,327
[45] Date of Patent: Dec. 8, 1998

[54] DIMENSIONALLY STABLE CORE FOR USE IN HIGH DENSITY CHIP PACKAGES

[75] Inventors: Paul J. Fischer; Robin E. Gorrell; Mark F. Sylvester, all of Eau Claire, Wis.

[73] Assignee: W.L. Gore & Associates, Inc., Newark, Del.

[21] Appl. No.: 747,169

[22] Filed: Nov. 8, 1996

[51] Int. Cl.⁶ .................................................. H05K 1/00
[52] U.S. Cl. ........................ 174/258; 428/308.4; 174/262
[58] Field of Search .................................. 174/262, 264, 174/265, 261, 255, 258; 361/792, 793, 794, 795, 719, 720, 721, 739; 428/308.4

[56] References Cited

U.S. PATENT DOCUMENTS

| | | | |
|---|---|---|---|
| 3,953,566 | 4/1976 | Gore | 264/288 |
| 4,482,516 | 11/1984 | Bowman et al. | 264/127 |
| 4,705,762 | 11/1987 | Ota et al. | 501/87 |
| 4,854,038 | 8/1989 | Wiley | 29/830 |
| 4,868,350 | 9/1989 | Hoffarth et al. | 174/68.5 |
| 4,894,271 | 1/1990 | Hani et al. | 428/137 |
| 4,985,296 | 1/1991 | Mortimer, Jr. | 428/220 |
| 5,034,801 | 7/1991 | Fischer | 257/687 |
| 5,045,642 | 9/1991 | Ohta et al. | 174/266 |
| 5,103,293 | 4/1992 | Bonafino et al. | 257/702 |
| 5,129,142 | 7/1992 | Bindra et al. | 29/852 |
| 5,301,118 | 4/1994 | Heck et al. | 364/468 |
| 5,383,788 | 1/1995 | Spencer | 429/67 |
| 5,498,467 | 3/1996 | Meola et al. | 428/198 |
| 5,509,200 | 4/1996 | Frankeny et al. | 29/852 |
| 5,512,360 | 4/1996 | King | 428/304.4 |
| 5,523,148 | 6/1996 | Afzali-Ardakani et al. | 428/260 |
| 5,527,593 | 6/1996 | Afzali-Ardakani et al. | 428/209 |
| 5,527,838 | 6/1996 | Afzali-Ardakani et al. | 523/223 |
| 5,529,836 | 6/1996 | Afzali-Ardankani et al. | 428/251 |
| 5,548,034 | 8/1996 | Afzali-Ardakani et al. | 525/390 |
| 5,599,611 | 2/1997 | Afzali-Ardakani et al. | 442/180 |
| 5,638,598 | 6/1997 | Nakaso et al. | 29/852 |
| 5,639,808 | 6/1997 | Coggio et al. | 523/452 |
| 5,652,285 | 7/1997 | Coggio et al. | 524/116 |
| 5,731,047 | 3/1998 | Noddin | 427/555 |
| 5,753,358 | 5/1998 | Korleski | 428/308.4 |

FOREIGN PATENT DOCUMENTS

| | | |
|---|---|---|
| 0 244 699 | 11/1987 | European Pat. Off. |
| 0 591 881 | 4/1992 | European Pat. Off. |
| 0 687 009 | 12/1995 | European Pat. Off. |
| 39 35 680 | 5/1991 | Germany. |
| 01228191 | 9/1989 | Japan. |

*Primary Examiner*—Bot L. Ledynh
*Assistant Examiner*—Kristina Soderquist
*Attorney, Agent, or Firm*—Victor M. Genco, Jr.

[57] ABSTRACT

A dimensionally stable core for use in high density chip packages is provided. The stable core is a metal core, preferably copper, having clearances formed therein. Dielectric layers are provided concurrently on top and bottom surfaces of the metal core. Metal cap layers are provided concurrently on top surfaces of the dielectric layers. Blind or through vias are then drilled through the metal cap layers and extend into the dielectric layers and clearances formed in the metal core. If an isolated metal core is provided then the vias do not extend through the clearances in the copper core. The stable core reduces material movement of the substrate and achieves uniform shrinkage from substrate to substrate during lamination processing of the chip packages. This allows each substrate to perform the same. Additionally, a plurality of chip packages having the dimensionally stable core can be bonded together to obtain a high density chip package.

9 Claims, 14 Drawing Sheets

DIMENSIONALLY STABLE CORE FOR USE IN HIGH DENSITY CHIP PACKAGES

FIELD OF THE INVENTION

The present invention is directed to a dimensionally stable core for high density chip packages which reduces material movement variability during the processing and the manufacture of the chip packages. The stable core, which provides the stability to the high density chip package, is preferably formed from a metal and includes concurrently formed dielectric and metal layers. Vias are subsequently formed to permit the manufacture of a high density chip package.

BACKGROUND OF THE INVENTION

High density chip package substrates require many vias which connect the input/output (I/O) of an integrated circuit chip to routing layers or power/ground layers buried within the chip package substrate. Conventional mechanical drilling processes which have been used in the past for the formation of vias are being replaced with laser via drilling processes. Laser via drilling processes offer the potential to form vias much more rapidly, and at less cost, than conventional mechanical drilling processes. To enable this rapid rate of via production, it is advantageous to use dielectrics which are thinner than those which have been used in the past. The thin dielectrics allow the formation of micro vias, i.e., vias <100 microns in diameter.

To effectively metallize these micro vias after they have been formed, the aspect ratio (the via's height divided by its diameter) must be maintained at a predetermined value. For example, for blind vias, the aspect ratio must be approximately one to insure that conventional metallization methods will be adequate to deposit a sufficient amount of metal onto the wall surface of the micro blind via.

As should be understood, it is disadvantageous to form micro blind vias in a dielectric material that contains a woven glass reinforcement. More particularly, if a woven glass reinforced dielectric is used, the laser power required to ablate the woven glass is as high as the laser power required to ablate a buried copper pad on the layer to which the blind via is to provide connection. Accordingly, the laser will penetrate the copper pad and continue into layers below, thus extending the via. After metallization, the unintentionally extended via will short to subsequent layers, causing the entire circuit to be scrapped.

In order to solve the shortcomings associated with forming micro blind vias in a dielectric material containing woven glass, dielectric material manufacturers have introduced thin, unreinforced prepregs to replace conventional glass reinforced prepregs. However, the use of such thin, unreinforced prepregs has caused other difficulties in the production of high density printed circuit boards and chip package substrates. More particularly, the elimination of woven glass from the dielectric material has reduced the dimensional stability of a chip package substrate. When thermosetting resins are used as a component of the dielectric material, these resins commonly induce shrinkage in a multilayer circuit board, or chip package substrate, upon lamination and curing of the resins. The shrinkage is limited to the order of a few thousand parts per million at most, and is not in itself a manufacturing problem, as the shrinkage can be compensated for when the artwork for the substrate is produced. However, variability in the degree of shrinkage exists, even for one unchanging circuit design. This variability in the degree of shrinkage can lead to reduced yields in high density printed circuit boards and chip packaging substrates. For example, if one of the internal layers in a multilayer circuit board is a ground or power layer consisting of a plane of copper, and if vias have to pass through clearances in this layer, the shrinkage variability induced during lamination can result in a variable location of the ground clearances from panel to panel. When vias are drilled in these circuits, some percentage of these vias may miss the clearances in the ground or power layer and strike the copper. After metallization, these vias would be shorted to the ground or power layer, resulting in a scrapped circuit.

There exists a need for a dimensionally stable core to facilitate the manufacture of high density chip packages having dielectric materials unsupported by woven glass.

SUMMARY OF THE INVENTION

The present invention includes a method of manufacturing high density chip package substrates by processing circuit layers concurrently on both sides of a metal core, which is preferably made of copper. The copper core improves the dimensional stability of thin, unreinforced dielectric materials used in the substrate. As a result of the metal core, material movement is reduced during lamination, which facilitates the processing and manufacture of the high density chip package. The metal core also provides buried capacitance which helps reduce simultaneous switching noise on the chip.

The dimensionally stable core of the present invention includes a metal core having at least one clearance etched therethrough, a dielectric layer on both sides of the metal core and filling the clearance, a metal cap layer on both sides of the dielectric layer, and drilled vias in the metal core through the metal cap layer. When the metal core is to be electrically isolated, vias are formed to extend through the metal cap layer, the dielectric layer and the clearance in the metal core, thus isolating the metal core. A metal layer is deposited on the wall surfaces of such vias. The dielectric layer and metal cap layer can be placed concurrently on top and bottom surfaces of the metal core. Additional dielectric layers and metal cap layers can again be concurrently laminated on top and bottom surfaces of the cap layers in a similar fashion. Additional vias, where necessary, are formed. Repeatedly adding dielectric and metal caps layers, and vias provides a dimensionally stable, high density chip package.

The metal core and the metal layers can be copper, or any other suitable metal, such that the coefficient of thermal expansion (CTE) of the chip package matches the CTE of the printed circuit board. The dielectric can be any unsupported prepreg. Further, the vias can be blind vias or through vias. The vias are drilled using a laser which ablates material as it drills.

A method for fabricating a dimensionally stable core according to the present invention includes providing a metal core, such as copper, placing dielectric layers on top and bottom surfaces of the metal core, placing metal cap layers, such as copper, on top and bottom surfaces of the dielectric layer and laminating the dielectric and metal cap layers together and to the metal core. The method further includes drilling vias through the metal cap layers, dielectric layers and the metal core, or clearances in the metal core, and then repeating the steps to form a multi-layer high density chip package.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings:

FIG. 3 is a side view of the metal core in FIG. 1 having a clearance etched through;

DETAILED DESCRIPTION OF THE INVENTION

The present invention is directed to a dimensionally stable core for high density chip packages. The stable core is a metal core, preferably copper, that contains clearances therein. Dielectric layers are placed on top and bottom surfaces of the metal core. Metal cap layers are placed on top and bottom surfaces of the dielectric layers, respectively. The dielectric layers and metal cap layers can be placed concurrently on both sides of the package. Blind or through vias are then drilled through the metal cap layers and into and through the dielectric layers and clearances in the metal core. A laser is used to drill the vias by ablating material where the vias are to be formed. If the metal core is to be a power or ground plane, the vias are formed directly through the metal core. If the metal core is an isolated metal core, then the vias extend through the clearances in the metal core, i.e., the metal core does not have vias making direct contact therewith.

The stable core reduces material movement of the substrate and achieves uniform shrinkage from substrate to substrate during lamination processing of the chip packages. This allows each substrate to perform the same. Additionally, a plurality of dimensionally stable core chip packages can be bonded together to obtain a high density chip package.

Figure 20:
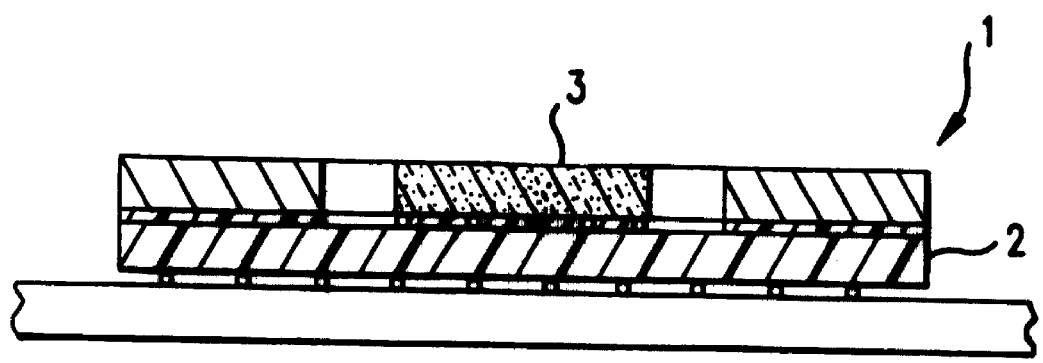
FIG. 20 illustrates a high density chip package i accordance with the teachings of the present invention.

FIG. 20 illustrates a high density chip package 1 in accordance with the teachings of the present invention. High density chip package 1 includes a substrate 2 which mechanically mounts a high density integrated circuit chip 3.

Figure 1:
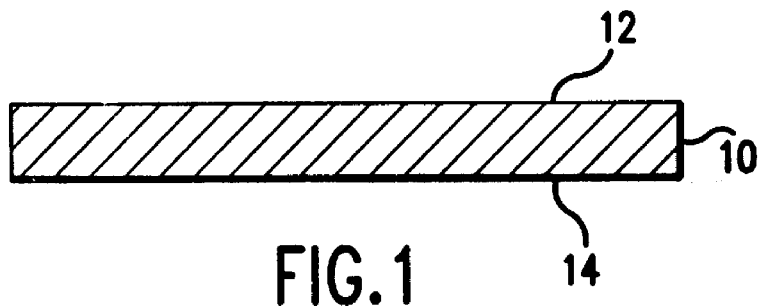
FIG. 1 is a side view of a metal core prior to processing.

As seen in FIG. 1, the metal core 10 is a metal sheet, such as a copper sheet, and has opposed rough surfaces 12 and 14 on both sides of the metal. The metal sheet has been treated by a process known as a "double treat" process. The rough surfaces allow better adhesion of the dielectric layers. Other metals can be used instead of copper as long as the coefficient of thermal expansion (CTE) of the metal core is closely matched to the CTE of the printed circuit board to which the chip package will eventually be attached. For example, CIC, a lamination of copper-INVAR 36-copper, can be used in place of a solid copper core. The nickel alloy that is used can contain from 30 wt % to 42 wt. % nickel. Metal core 10 must be of sufficient thickness to impart dimensional stability to the finished substrate, e.g., between 0.0005 inches and 0.0028 inches, preferably 0.0014 inches. A thickness in this range provides a lower flexural modulus to the chip package.

Figure 2:
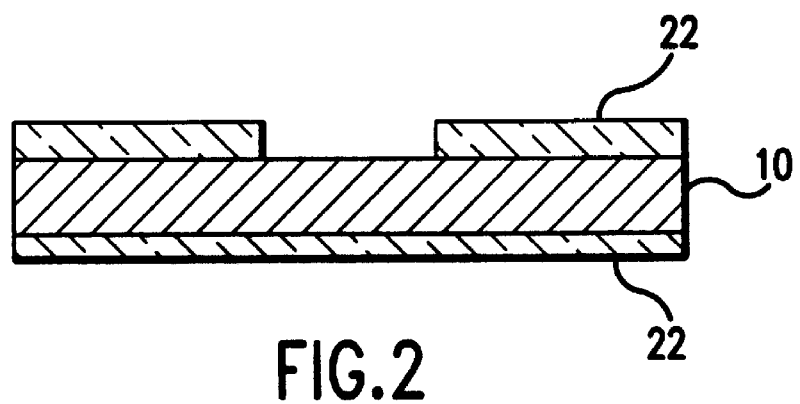
FIG. 2 is a side view of a metal core having a patterned photoresist thereon prior to etching.
Figure 3:
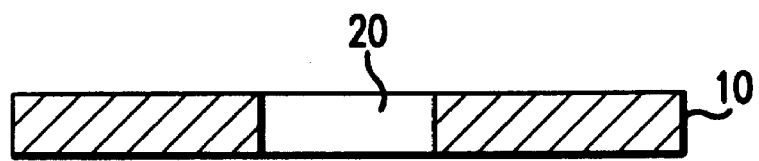

As seen in FIG. 2, a photoresist 22 is applied to both sides of the metal core 10 and is imaged with a pattern of clearances 20 where vias are to be formed, using a conventional method. The imaged areas are chemically etched, using conventional processes, to remove the copper and form clearances 20 (FIG. 3). The clearances 20 are wider in diameter than vias that will be formed later. The dimensions of the vias are dependent on the type of dielectric that will be placed on the metal core. The photoresist is then removed using conventional processes.

Figure 4:
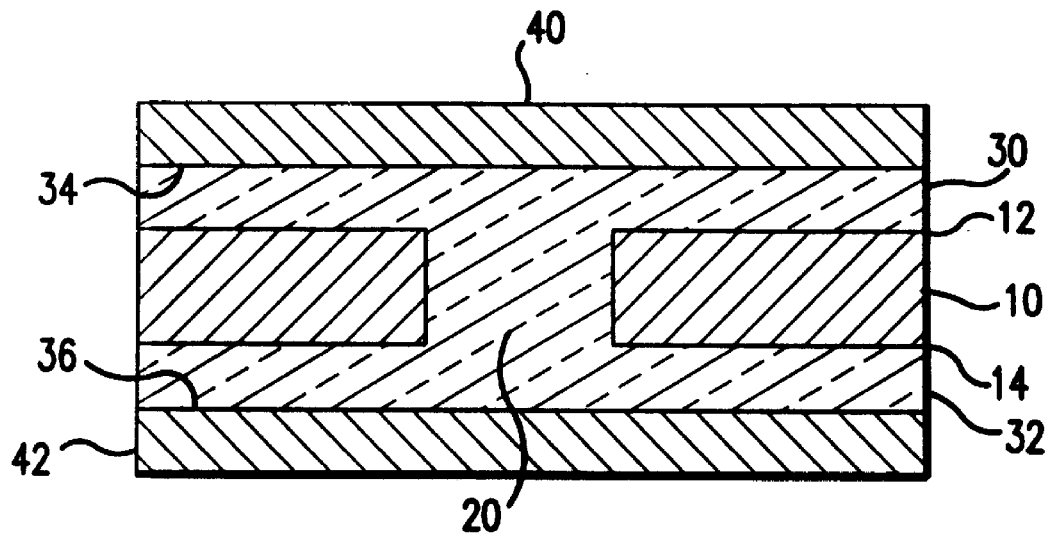
FIG. 4 is a side view of a substrate after a dielectric and metal "cap" layers have been laminated to the metal core.

As seen in FIG. 4, the metal core 10, including at least one clearance 20, includes dielectric layers 30 and 32. Preferably, the dielectric layers 30 and 32 are formed concurrently on the surfaces 12 and 14 of metal core 10. The CTE of the dielectric layers 30 and 32 can be as high as 40 ppm/° C. The dielectric layers 30 and 32 must be of sufficient thickness to fill the clearances 20. The thickness of the dielectric layers 30 and 32 is at least 5 microns or larger, and is typically between 25 microns and 50 microns. The thickness is chosen so that there is no loss of dimensional stability of the substrate. The dielectric thickness should not be significantly greater than the thickness of the metal core 10, or dimensional stability of the substrate will decrease.

Metal core 10 includes metal cap layers 40 and 42 on surfaces 34 and 36 of dielectric layers 30 and 32, respectively. Metal cap layers 40 and 42 are concurrently placed on surfaces 34 and 36 of the dielectric layers, and are formed from copper. The caps layers 40 and 42 can be formed from any suitable conductive metal, The metal core 10, dielectric layers 30 and 32, and the metal cap layers 40 and 42 are laminated together using any suitable lamination process.

In one embodiment of the present invention layers 30 and 32 were formed from SPEEDBOARD C®, manufactured by W. L. Gore and Associates. The dielectric layers 30 and 32 were laminated to the core 10 at a pressure of 300–350 psi, and a temperature ramp rate of 5°–7° C. per minute up to a temperature of 177° C. The temperature was held at 177° C. for 30 minutes. The temperature was then raised to 220°–225° C. and held for 60 minutes. The lamination was slowly cooled for several hours while the substrate was under pressure.

Figure 5:
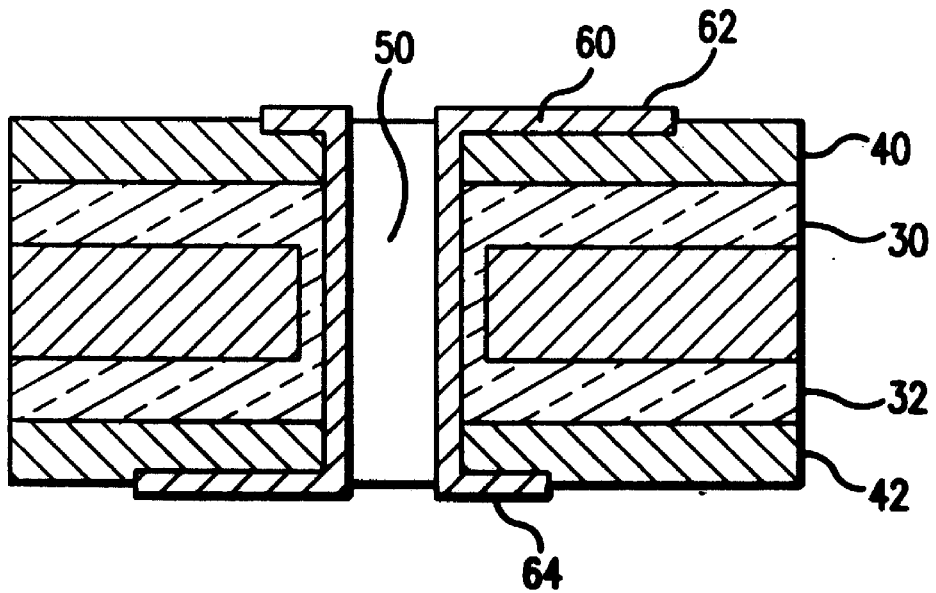
FIG. 5 is a side view of the substrate according to the present invention after vias have been laser drilled and metallized, and circuit traces have been formed.

As shown in FIG. 5, the laminated dielectric layers 30 and 32, and the metal cap layers 40 and 42 are processed to contain at least one via 50 which is drilled through the metal cap layers 40 and 42 and dielectric layers 30 and 32.

FIG. 5 shows via 50 as a through via, which can be drilled using any known process, such as, lasing, for example. For through via 50, the laser must be capable of penetrating dielectric layers 30 and 32 and the metal core 10, when not passing through clearance 20. The through via 50 can have an aspect ratio varying from 1:1 to 20:1, or higher. When blind vias are formed, the laser has to penetrate the dielectric layers 30 or 32, but not the metal core 10. Atypical aspect ratio of 1:1 should be maintained. However, the aspect ratio is not limited to 1:1.

In accordance with the present invention, to obtain uniform laser via formation with suitable aspect ratios, a pulse repetition rate ranges from 1 KHz to 10 MHZ, which varies the pulse width of the laser. Residue remaining in the vias is then ablated by again adjusting the pulse intensity. Lasers capable of producing energy densities in the range of 0.5 to 20 J/cm$^2$, and those capable of making in situ and virtually instantaneous changes in the energy density by varying the pulse repetition rate from 1 KHz to 10 MHZ, are employed.

Figure 7:
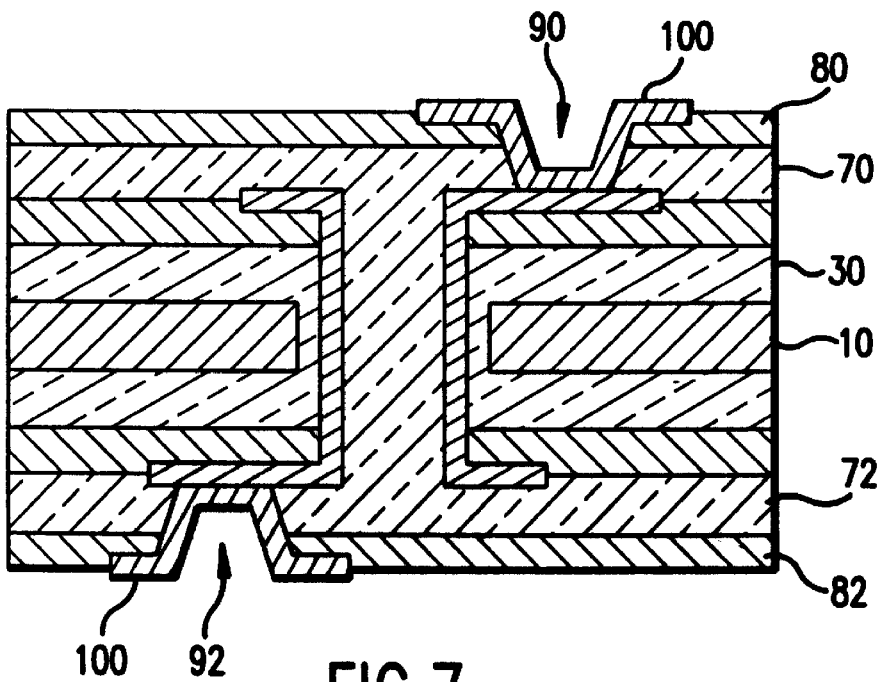
FIG. 7 is a side view of the finished chip package according to the present invention, after blind vias have been drilled.

In one embodiment of the present invention, such as that of FIG. 7, blind vias were formed with lasers that are solid state pulsed lasers such as a pulsed Nd:YAG laser. The fundamental output from the Nd:YAG laser is at a wavelength of 1064 nm. This wavelength is in the infrared portion of the electromagnetic spectrum. By installing beta-barium borate (BBO) crystals in the optical path, harmonic generation facilitates the output of light at 355 nm (third harmonic) and 266 nm (fourth harmonic), which fall in the ultraviolet range. The 355 nm and 266 nm wavelengths are particularly well suited for drilling vias in the laminated substrates of the present invention.

In general, the pulse length, energy density and number of pulses can be varied depending on the type of via being formed and the type of materials used in the laminated substrate. When drilling blind vias in a laminated substrate made of alternating layers of copper and a dielectric comprised of adhesive, filler and expanded polytetrafluoroethylene (ePTFE), and using a 266 nm laser, the energy density is 1.5 J/cm$^2$, the energy per pulse is 10 J, and the power density is 20 megawatts per cm$^2$. At the 355 nm wavelength, blind vias are formed by setting the energy density at 3.5 J/cm$^2$, the energy per pulse is 30 J, and the power density is 35 megawatts per cm$^2$. The post-pulse step for the blind vias using a 355 nm laser requires adjusting the conditions such that the energy density is 11 J/cm$^2$, the energy per pulse is 100 J, and the power density is 200 megawatts per cm$^2$.

When forming blind vias in the adhesive-filler-ePTFE dielectric material using the 355 nm laser, the energy density is 7 J/cm$^2$, the energy per pulse is 65 J, and the power density is 100 megawatts per cm$^2$. A post-pulse step would require adjusting these parameters such that the energy density is 11 J/cm$^2$ the energy per pulse is 100 J, and the power density is 200 megawatts per cm$^2$.

As shown in FIG. 5, through via 50 is metallized by forming a metal layer 60 on the surface of the via 50. The metal layer 60 includes, for example, a layer of electroless copper formed on the surface of the via 50 and a layer of electrolytic copper formed on the layer of electroless copper using conventional processes. The metal layer 60 extends onto the metal cap layers 40, 42 and the dielectric layers 30, 32. Traces (not shown), i.e., signal wires, are then etched on the metal cap layers 40, 42 and the metal layers 60 by techniques known in the art. That is, for inner layer traces, i.e., traces that are not on a final layer, the top most metal cap layers 40, 42, and metal layer 60 are imaged with a photoresist. The photoresist is patterned and then developed so that the photoresist defines the signal traces in the area beneath the photoresist. The metal between the patterned photoresist is then etched and any remaining photoresist is stripped away leaving traces around the vias. This is referred to as a subtractive process.

For final layer traces, i.e., traces on a final layer, the top most metal cap layers 40, 42 and the metal layer 60 are imaged with a photoresist. The photoresist is then patterned and developed so that the photoresist is removed where the signal traces are to be formed. Additional metal, such as copper, is plated where the photoresist was removed. Then an etch resistant metal, such as nickel, gold, tin or solder, is plated on the additional metal, the photoresist is stripped off and the metal cap layers 40, 42 under the photoresist is etched off. Areas that are to remain are plated with the metal, and areas that are to be etched away, are exposed. This is referred to as a semi-additive process.

Preferably, as much of the metal layer 60 as possible should be left on the dielectric layers 30 and 32 to further aid in producing a dimensionally stable substrate. If the metal layer 60 is a ground or power plane, a large amount of metal, such as copper, would remain by operation of the process employed.

Figure 6:
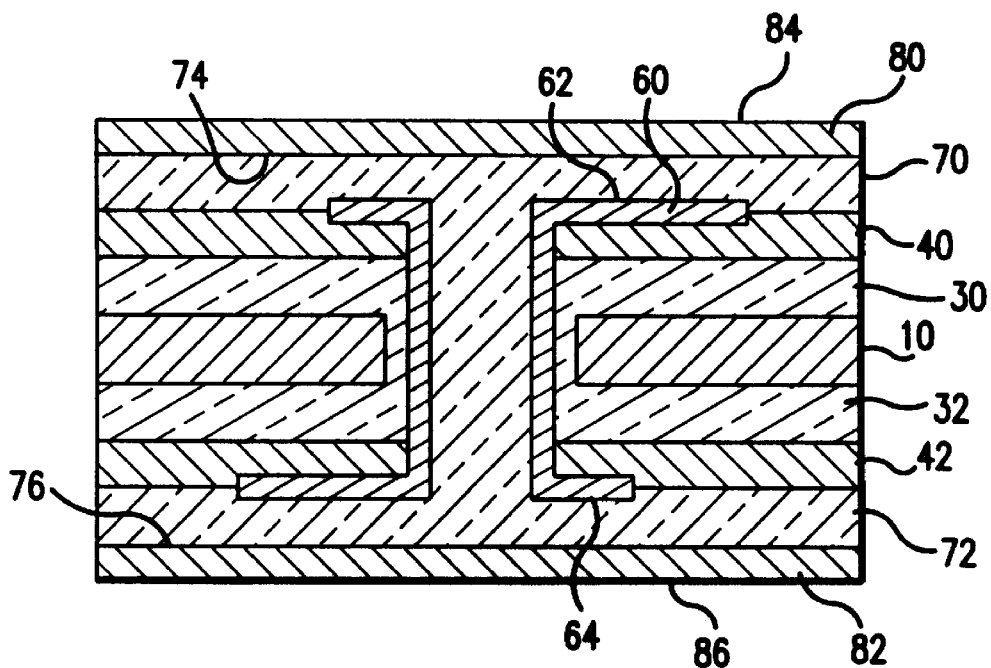
FIG. 6 is a side view of the substrate in FIG. 4 after additional dielectric and metal "cap" layers are added.

FIG. 6 shows another embodiment of the present invention wherein metal cap layers 40 and 42, and metal layer 60 are not a final layer. In this embodiment, additional dielectric layers 70 and 72 are respectively placed on surfaces 62 and 64 of metal layer 60. Additional dielectric layers 70 and 72 fill the via 50 and extend over the metal layer 60, the dielectric layers 30 and 32 and the remaining cap layers 40 and 42. The additional dielectric layers 70 and 72 encapsulate the traces.

Additional metal cap layers 80 and 82, such as copper, are placed on the surfaces 74 and 76 of dielectric layers 70 and 72, respectively. The additional dielectric layers 70 and 72, as well as, additional metal cap layers 80 and 82 can be placed concurrently on both sides of the package. The dielectric layers 70 and 72 and metal cap layers 80 and 82 are then laminated together as described hereinabove.

FIG. 7 shows an embodiment where blind vias are added to the substrate of FIG. 6. Blind vias 90 and 92 are formed in metal cap layers 80 and 82 respectively, as well as, dielectric layers 70 and 72, by using laser drilling techniques as described hereinabove. The vias 90 and 92 are shown as blind vias, but could be through vias such that they extend completely through the substrate, connecting any layer to any other layer in the substrate. The vias 90 and 92 are then metallized by forming a metal layer 100 using suitable plating processes. The blind vias 90 and 92 have pads 100 which can be further processed to have metal traces (not shown) using techniques known in the art. It is possible to continue adding dielectric and cap layer, concurrently or otherwise, as set forth above, to form seven, nine, or more layers.

It should be understood that a preferred chip package and method for making the preferred chip package have been explained. However, for example, the dielectric and metal layers can be placed one layer at a time, rather than concurrently, on the substrate.

In another embodiment of the present invention, the substrates, such as those depicted in FIGS. 5 or 7, or other containing three, five, seven, or more layers, as set forth above, can be bonded together to form a very dense chip package, or a very dense printed circuit board. The individual substrate layers are bonded together using a conductive z-axis material.

For a chip package having a copper metal core with dielectric and metal cap layers concurrently formed thereon as set forth above, the chip packages have a pressure applied thereto of approximately 300–350 psi and a temperature ramp rate of approximately 5°–7° C. per minute up to a temperature of approximately 177° C. The temperature is held at 177° C. for approximately 30 minutes. The temperature is then raised to approximately 220° C.–225° C. for approximately 60 minutes. The chip package is then slowly cooled under pressure of approximately 300–350 psi which has been maintained through out the bonding process. Cooling occurs in a few hours.

Figure 8:
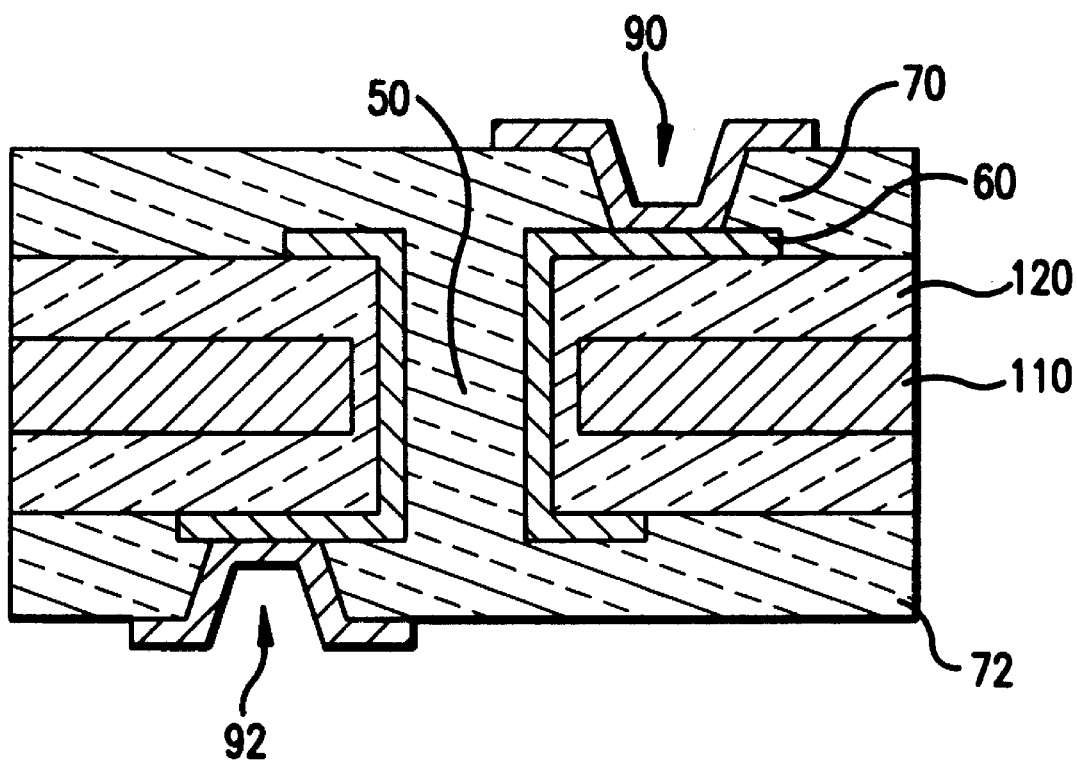
FIG. 8 is a side view of a substrate according to a preferred embodiment of the present invention.

FIG. 8 shows a chip package according to the present invention having an electrically isolated copper core 110 and a prepreg sheet 120. The prepreg sheet 120 is produced by W. L. Gore & Associates under the name SPEEDBOARD®. Such a prepreg sheet has a dielectric constant of about 2.6–2.7 at 1 MHz–10 GHz, a glass transition temperature (Tg) of 220° C., a flow of less than 4%, and a cure temperature of 177° C. to 225° C. Prepreg sheet 120 has a thickness ranging from about 25 microns to about 175 microns.

The substrate of FIG. 8 has been evaluated and compared to a system using a conventional polyimide core. Optical registration targets on the chip package utilizing the substrate of FIG. 8 were measured after the final lamination steps and compared with a chip package having a substrate containing a conventional polyimide core to determine the dimensional variability of each chip package. Post lamination shrinkage standard deviation was found to be on the order of 200 parts per million for the conventional polyimide core construction. The post lamination shrinkage standard deviation was found to be on the order of only 25 parts per million for the chip package made in accordance with the teachings of the present invention.

For a high density chip package, such a substantial decrease in the post lamination shrinkage standard deviation can significantly decrease scrap due to shorted and open vias. It also allows construction of substrates to be carried out on larger sized panels, as the effect of a high post lamination shrinkage standard deviation is magnified at the edges of the printed circuit board.

In the above examples, a particular dielectric material was used to form the packages. However, any suitable dielectric material can be used in the present invention, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be polytetrafluoroethylene (PTFE), expanded polytetrafluoroethylene (ePTFE), or copolymers or blends. Suitable fluoropolymers include, but are not limited to, polytetrafluoroethylene or expanded polytetrafluoroethylene, with or without an adhesive filler mixture.

Preferred materials include SPEEDBOARD® bond plies available from W. L. Gore and Associates, such as, SPEEDBOARD® C which is a prepreg of non-woven material containing a cyanate ester resin in a polytetrafluoroethylene matrix. SPEEDBOARD® C has a dielectric constant, (Dk) of 2.6–2.7 at 1 MHz–10 GHz, a loss tangent of 0.004 at 1 MHz–10 GHz, a dielectric strength greater than 1000 V/mil, a glass transition ($T_g$) of 220° C., a resin content of 66–68 wt.% and is available in a variety of thicknesses.

Figure 9:
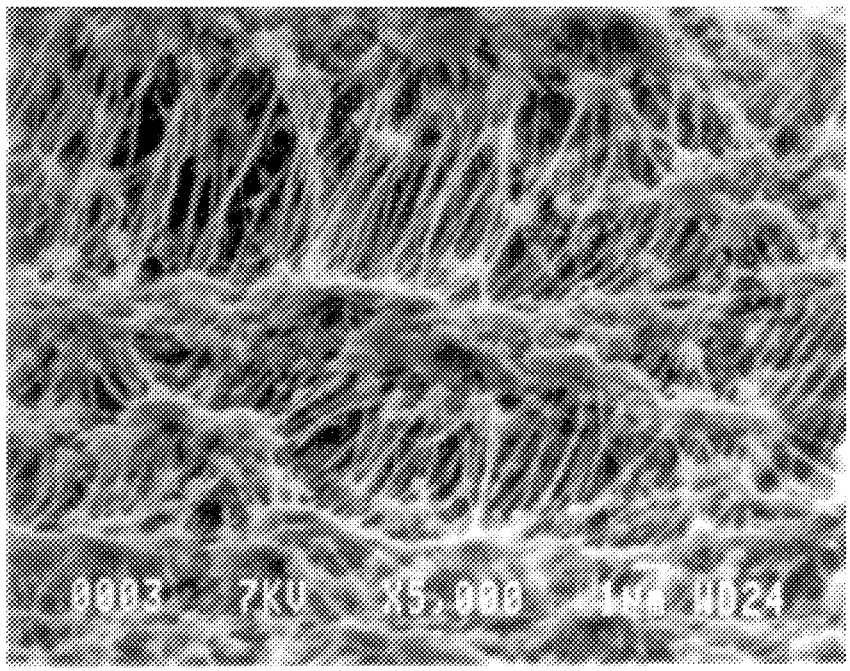
FIG. 9 is a scanning electronmicrograph of an expanded polytetrafluoroethylene (ePTFE) material that can be used as the dielectric layer in the present invention.

Another suitable dielectric is the expanded PTFE matrix, shown in FIG. 9, that includes a mixture of at least two of a cyanate ester compound, an epoxy compound, a bistriazine compound and a poly (bis-maleimide) resin. For example, a varnish solution was made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths –20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web can be any desired thickness, such as 25 microns, 40 microns, for example. A 25 microns thick material has a mass of approximately 0.9 g and a weight per area of approximately 11.2 to 13.8 g/m².

Figure 10:
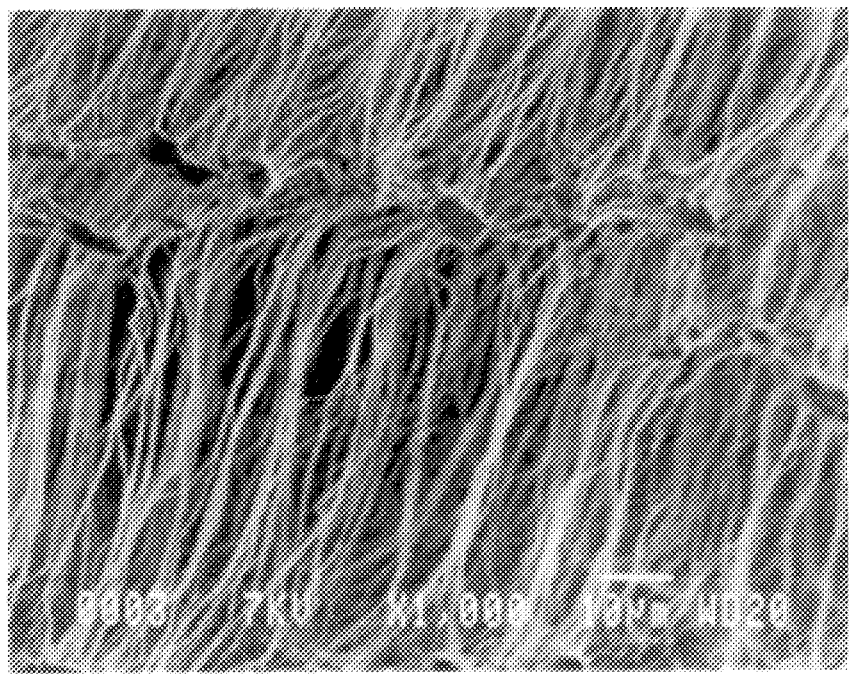
FIG. 10 is a scanning electronmicrograph of an expanded PTFE material that forms the matrix that contains the adhesive filler to form one dielectric material in the present invention.

Another embodiment of the present invention is defined by dielectric layers 30, 32, 70 and 72 which are formed from a porous matrix system that is imbibed or impregnated with an adhesive-filler mixture. FIG. 10 shows the node-fibril infrastructure of an ePTFE matrix which exemplifies one embodiment of such a porous matrix system.

In general, in the present invention, the porous matrix is a non-woven substrate that is imbibed with high quantities of filler and a thermoplastic or thermoset adhesive, as a result of the initial void volume of the substrate. Such a porous matrix is then heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) should be between about 2 to 5 times, or above, that of the largest particulate, with a MFPS of greater than about 2.4 times that of the largest particulate being particularly preferred. However, it is also within the scope of the present invention that suitable composites can be prepared by selecting a ratio of the mean flow pore size to average particle size of greater than 1.4. Acceptable composites can also be prepared when the ratio of the minimum pore size to average particle size is at least above 0.8, or the ratio of the minimum pore size to the maximum particle size is at least above 0.4. Such ratio may be performed with a Microtrak® Model FRA Particle Analyzer.

Alternatively, another mechanism for gauging relative pore and particle sizes may be calculated as the smallest pore size being not less than about 1.4 times the largest particle size.

In addition to the expanded fluoropolymer substrates described hereinabove, porous expanded polyolefins, such as ultra high molecular weight (UHMW) polyethylene, expanded polypropylene, or polytetrafluoroethylene prepared by paste extrusion and incorporating sacrificial fillers, porous inorganic or organic foams, microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles which, when analyzed by a Microtrak® Model FRA Partical Analyzer device, displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silylating agents, silazanes, silanols, siloxanes. Suitable silazanes, include, but are not limited to, hexamethyldisilazane (Huls H730) and hexamethylcyclotrisilazane, silylamides such as bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT (tetrakis(2-ethyl-hexyl) titanate), Tyzor® TPT (tetraisopropyl titanate), chelated titanates, Tyzor® GBA (titanium acetylacetylacetonate), Tyzor® DC (titanium ethylacetacetonate), Tyzor® CLA (proprietary to DuPont), Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, and tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane,, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, mean flow pore size and minimum pore size were determined using the Coulter®) Porometer II (Coulter Electronics Ltd., Luton UK) which reports the value directly. Average particle size and largest particle size were determined using a Microtrak® light scattering particle size analyzer Model No. FRA (Microtrak Division of Leeds & Northup, North Wales, Pa., USA). The average particle size (APS) is defined as the value at which 50% of the particles are larger. The largest particle size (LPS) is defined as the largest detectable particle on a Microtrak® histogram. Alternatively, the largest particle size is defined as the minimum point when the Microtrak® Model FRA Particle Analyzer determines that 100% of the particulate has passed.

In general, the method for preparing the adhesive-filler dielectric involves: (a) expanding a polytetrafluoroethylene sheet by stretching a lubricated extruded preform to a microstructure sufficient to allow small particles and adhesives to free flow into the void or pore volume; (b) forming a paste from polymeric, e.g., thermoset or thermoplastic material and a filler; and (c) imbibing by dipping, coating, or pressure feeding, the adhesive-filler paste into the highly porous scaffold, such as expanded polytetrafluoroethylene.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Sample | Substrate Pore Size Min (μm) | Substrate Pore Size MFPS (μm) | Particle Size Avg (μm) | Particle Size Max (μm) | MFPS ÷ Part$_{Avg}$ | Pore$_{Min}$ ÷ Part$_{Max}$ | Pore$_{Min}$ ÷ Part$_{Avg}$ | Result |
|---|---|---|---|---|---|---|---|---|
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

EXAMPLE 1

A fine dispersion was prepared by mixing 281.6 g TiO$_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 minute under tension to afford a flexible composite. The partially-cured adhesive composite thus produced comprised of 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 minute then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 minute under tension to afford a flexible composite. Several plies of this prepreg were laid up between copper foil and pressed at 250 psi in a vacuum-assisted hydraulic press at temperature of 225° C. for 90 minute then cooled under pressure. This resulting dielectric thus produced comprised of 53 weight percent SiO$_2$, 5 weight percent PTFE and 42 weight percent adhesive, displayed good adhesion to copper, dielectric constant (at 10 GHZ) of 3.3 and dissipation factor (at 10 GHZ) of 0.005.

EXAMPLE 3

A fine dispersion was prepared by mixing 483 g SiO$_2$ (HW-11-89) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 minute under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent SiO$_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg TiO$_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" TiO$_2$-filled expanded PTFE (filled according to the teachings of Mortimer U.S. Pat. No. 4,985,296, except to 40% loading of TiO$_2$ and the membrane was not compressed at the end) was then dipped into the resin mixture, removed, and then dried at 165° C. for 1 minute under tension to afford a flexible composite. The partially cured adhesive composite thus produced comprised of 70 weight percent TiO$_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 5

A fine dispersion was prepared by mixing 7.35 kg SiO$_2$ (ADMATECHS SO-E2, Tatsumori LTD) with 7.35 kg MEK and 73.5 g of coupling agent, i.e.,3-glycidyloxypropyltrimethoxysilane (Dynasylan GLYMO (Petrach Systems)). SO-E2 is described by the manufacture as having highly spherical silica having a particle diameter of 0.4 to 0.6 mm, a specific surface area of 4–8 m$^2$/g, and a bulk density of 0.2–0.4 g/cc (loose).

To this dispersion was added 932 g of a 50% (w/w) solution of a cyanated phenolic resin, Primaset PT-30 (Lonza Corp.) in methylethylketone (MEK), 896 g of a 50% (w/w) solution of RSL 1462 (Shell Resins, Inc.(CAS #25068-38-6)) in MEK, 380 g of a 50% (wlw) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.)), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

The fine dispersion was poured into an impregnation bath. A expanded polytetrafluoroethylene web having the node fibril structure of FIG. 10, and the following properties:

| | |
|---|---|
| Frazier | 20.55 |
| Coverage | 9 g/m$^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter).

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure is fixed by raising the web into contact with the ball of the burst probe. Pressure at break is recorded.

The web described above was passed through a constantly agitated impregnation bath at a speed at or about 3 ft./minute to insure uniformity. The impregnated web was immediately passed through a heated oven to remove all or nearly all the solvent, and was collected on a roll.

Several plies of this prepreg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on SiO$_2$ prepared from the vapor combustion of molten silicon was prepared as follows. Two precursor mixtures were initially prepared. One being in the form of a slurry containing a silane treated silica similar to that of Example 5 and the other an uncatalyzed blend of the resin and other components.

Mixture I

The silica slurry was a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product was an MEK based mixture containing an uncatalyzed resin blend (the adhesive) contains approximately 60% solids, where the solid portion was an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level was 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture 1. Then mixture II was added to the container to provide 5.64 pounds of solids, e.g., 59.6% solids, 9.46 pounds of mixture II. The, 3.45 grams of the manganese catalyst solution (0.6% in mineral spirits) was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent, 3-glycidyloxypropyl-trimethoxysilane (Petrach Systems)). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/minute This dispersion was constantly agitated to insure uniformity. The impregnated web was immediately passed through a heated oven to remove all or nearly all the solvent, and was collected on a roll.

Several plies of this prepreg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (P.N. P-88-1591)) in MEK, 2456 grams of a 76.8% (wlw) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/minute The dispersion was constantly agitated so as to insure uniformity. The impregnated web is immediately passed through a heated oven to remove all or nearly all the solvent, and is collected on a roll.

Several plies of this prepreg were laid up between copper foil and pressed at 200 psi in a vacuum-assisted hydraulic press at temperature of 220° C. for 90 minutes then cooled under pressure. This resulting dielectric displayed good adhesion to copper.

As set forth above, the present invention provides a dimensionally stable core for chip packages. This core is a metal core such as copper or INVAR plated with copper, for example. Copper is one of the preferable materials since it is easier to match the CTE of the chip packages to that of the printed circuit board to which it is bonded. This allows the package to be easier to handle because the metal provides needed stability to the package. Concurrently placing layers on top and bottom surfaces of the chip package and concurrently laminating the layers allows the fabrication process of the chip packages to be more efficient. In addition, the amounts of metal on each layer on each side of the substrate are balanced so that the package is easily attached to a chip. An additional advantage of a metal core includes providing buried capacitance which helps reduce simultaneous switching noise on the chip.

Figure 11:
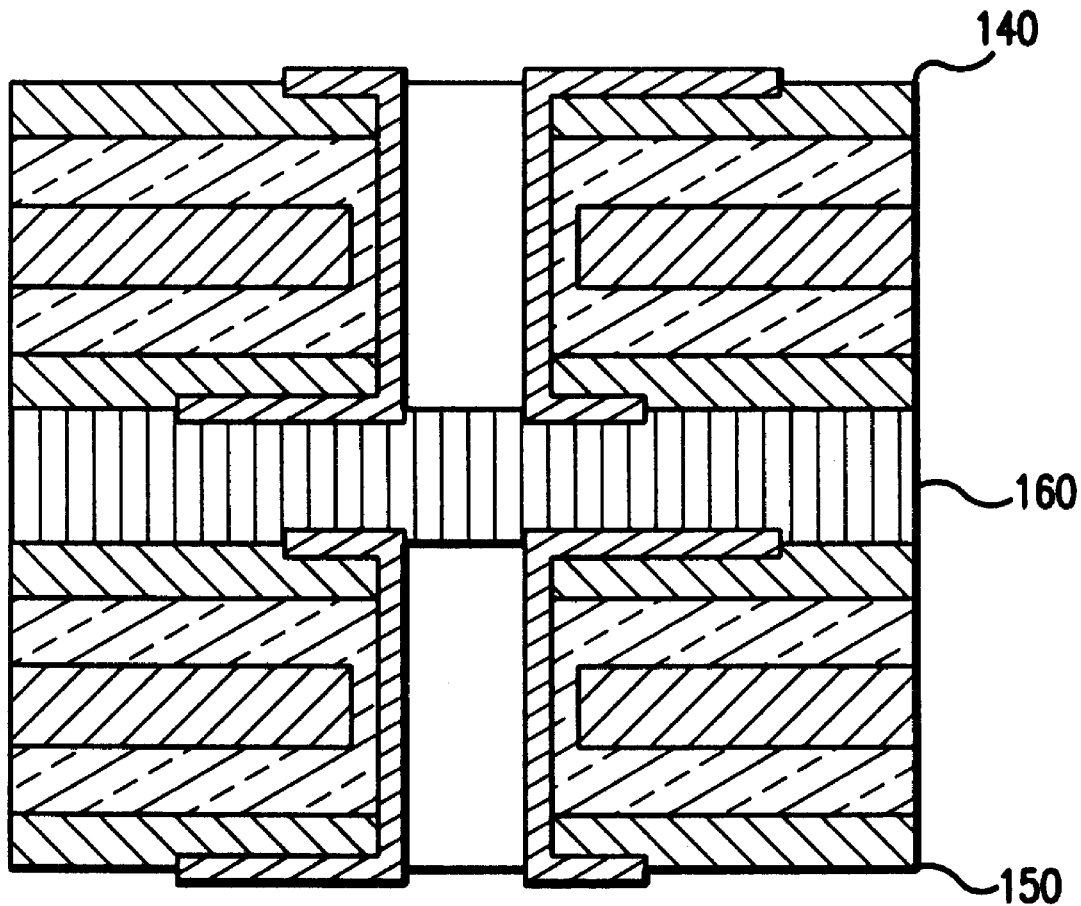
FIG. 11 shows two substrates laminated together using a conductive z-axis material.
Figure 19:
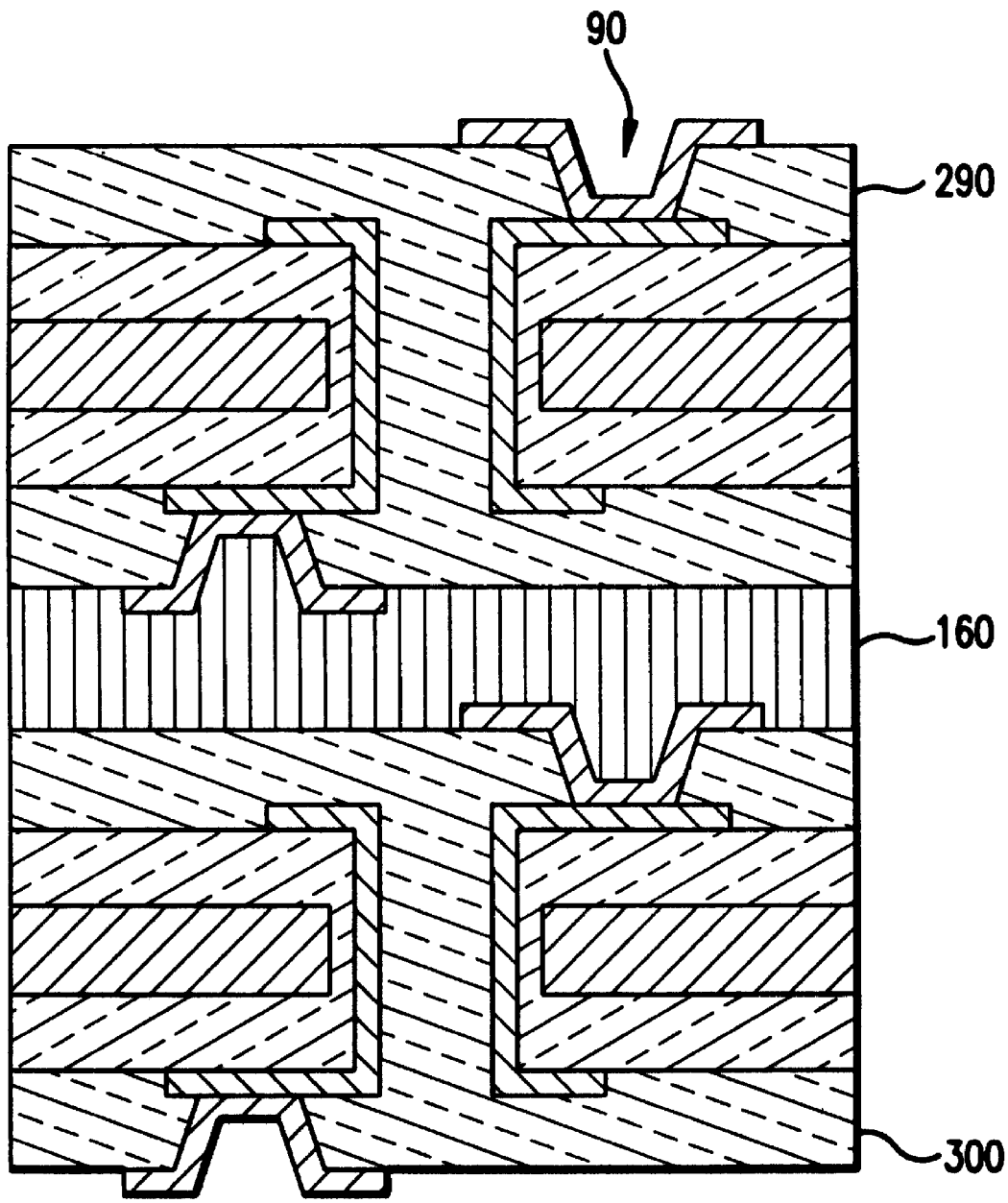
FIG. 19 shows two substrates containing blind vias laminated together with a conductive Z-axis material.

As shown in FIG. 11, multilayer substrates using a conductive z-axis material, such as that taught in U.S. Pat. No. 5,498,467, which is incorporated herein by reference, may be used. Thus, multiple layers are bonded together using such a conductive z-axis material to obtain a very dense printed circuit board. One hundred or more layers could conceivably be achieved. In FIG. 11, substrates 140 and 150 are identical to one another, and are similar in structure to the dimensionally stable substrate of FIG. 5. Substrates 140 and 150 are laminate together with conductive z-axis material 160 which is described in greater detail below. FIG. 19 shows the substrates 290 and 300, which are similar to that of FIG. 8, laminated together with conductive z-axis material 160, which is described below in reference to FIGS. 12–14.

Figure 12:
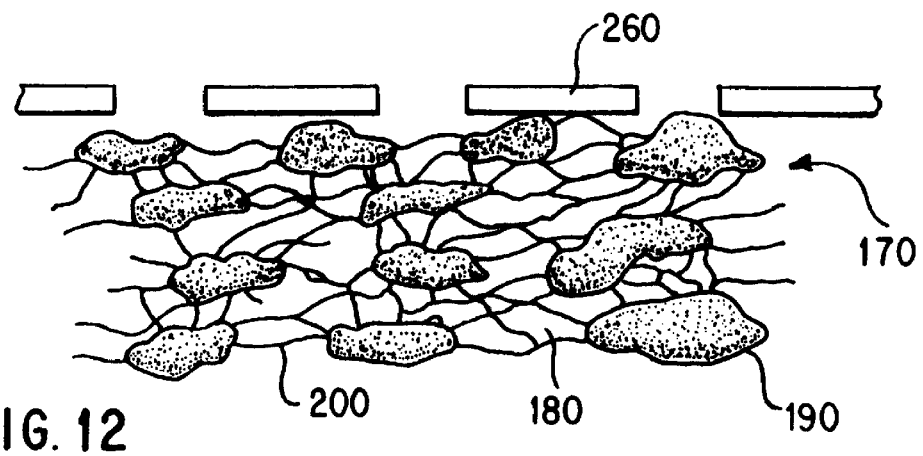
FIGS. 12–14 schematically show the formation of a conductive z-axis material containing irregularly shaped conductive pathways.
Figure 13:
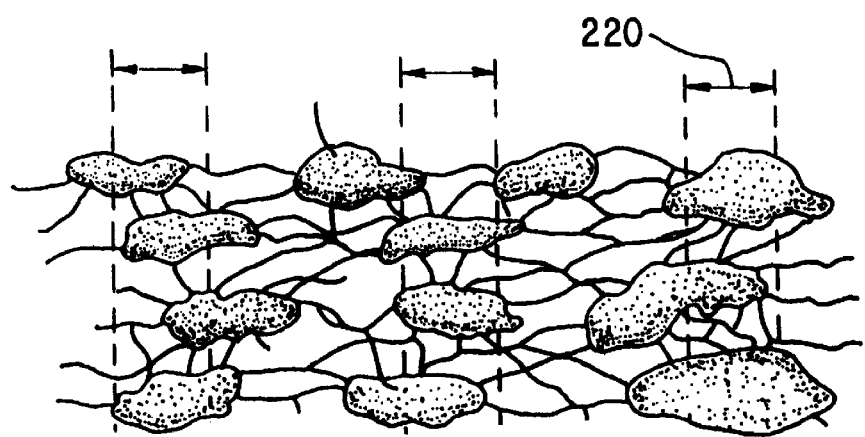
Figure 14:
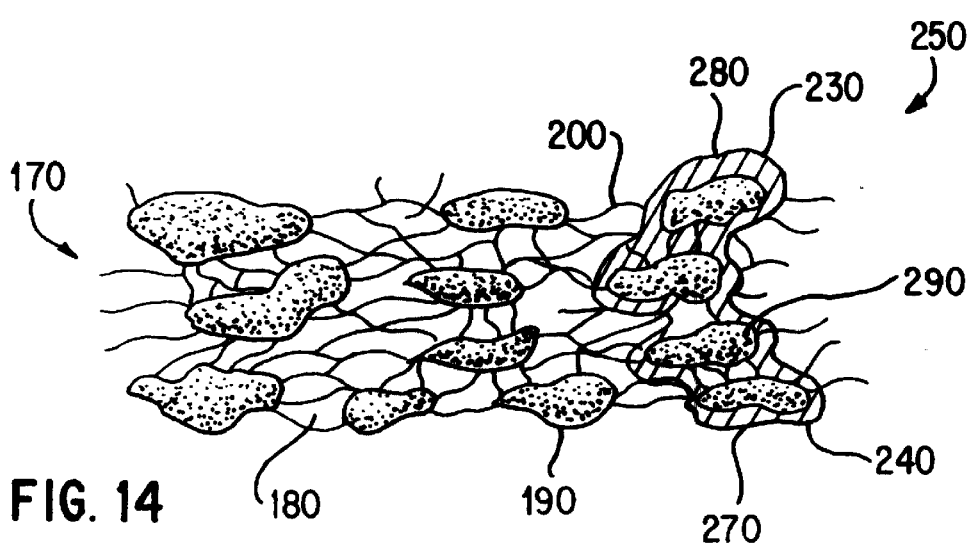

The multilayer packages that are exemplified in FIG. 11, are prepared by using a conductive z-axis material, such as that described in the '467 patent discussed above, having irregularly shaped conductive pathways that extend through the thickness of the z-axis material. The substrate for forming the conductive z-axis material is a planar, open cell, porous member having continuous pores from one side to the other. The porous planar member must have an internal morphology in which the material defining the pores forms an irregular path through the Z-axis direction within a vertically defined cross section through the Z-axis plane, as shown in FIGS. 12–14.

Suitable materials for the conductive z-axis member have a thickness on the order of $5\times10^6$m and $5\times10^4$m (5 and 500 microns), and include woven or non-woven fabric, such as a nylon, glass fiber or polyester fabric or cotton, or the like. The member can also be a porous polymeric film or membrane, that is flexible, such as porous polyolefins, e.g., porous polyethylene, porous polypropylene, porous fluoropolymers, or open cell, porous polyurethanes. Additionally, open cell, porous inorganic materials, such as thin porous ceramic plates that have continuous pores from one side to the other can be used.

Porous fluoropolymers include, but are not limited to, porous polytetrafluoroethylene (PTFE), porous expanded polytetrafluoroethylene (ePTFE), porous copolymers of polytetrafluoroethylene and polyesters or polystyrenes, copolymers of tetrafluoroethylene and fluorinated ethylene-propylene (FEP) or perfluoroalkoxy -tetrafluoroethylene (PFA) with a $C_1$–$C_4$ alkoxy group. Preferred porous materials include expanded polypropylene, porous polyethylene and porous polytetrafluoroethylene. Most preferably, the material is expanded polytetrafluoroethylene having a microstructure of nodes interconnected with fibrils, a void volume of about 20 to 90%, such as the material prepared in accordance with the teachings of U.S. Pat. No. 3,953,566, which has been incorporated herein by reference.

In general, the conductive z-axis member will have a thickness of between about 5 and 500 microns, preferably between about 5 and 125 microns, but thickness is not a critical factor so long as ultra-violet light will penetrate the sample.

Referring to FIGS. 12–14, material 170 for forming the conductive z-axis member is expanded polytetrafluoroethylene, having pores 180 which are defined as the space between nodes 190 interconnected with fibrils 200. The internal structure of nodes 190 interconnected with fibrils 200 is of a material density that results in an irregular continuous path through the Z-axis within a vertically defined cross section 220, from one side 230 of the planar member to the other side 240 (see FIG. 14).

As taught in the '467 patent, the selectively conductive member 250 (FIG. 14) is prepared by making areas 220, through the Z-axis direction, receptive to the deposition of a metal salt, which metal salt on exposure to radiant energy is converted to nonconductive metal nuclei which then act to catalyze the deposition of a conductive metal from an electroless metal deposition solution. The pores 180 of a porous member 170 are first wetted with a wetting agent, such as an alcohol, or organic aqueous surfactant. Methanol, propanol, tetrafluoroethylene/vinyl alcohol copolymers or the like may be used. The wetting agent acts to make the material of the member receptive to conductive metals such as nickel or copper. Particularly preferred is copper.

A radiation sensitive metal salt composition is a liquid radiation sensitive composition comprising a solution of a light sensitive reducing agent, a metal salt, a source of halide ions, and a second reducing agent. The radiation sensitive solution contains water, the metal salt, a light sensitive reducing agent, a second reducing agent, and optionally (for hard to wet surfaces) a surfactant. The metal salt includes, but is not limited to, copper acetate, copper formate, copper bromide, copper sulfate, copper chloride, nickel chloride, nickel sulfate, nickel bromide, ferrous bearing compounds, such as, ferrous sulfate, ferrous chloride, and noble metals such as palladium, platinum, silver, gold and rhodium, Suitable light-sensitive reducing agents are aromatic diazo compounds, iron salts, e.g., ferrous or ferric oxalate, ferric ammonium sulfate, dichromates e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

The second reducing agents, include, but are not limited to, polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducing agents are aldehydes, such as formaldehyde, benzaldehyde, acetaldehyde, n-butyraldehyde, polyamides, such as nylon, albumin and gelatin; leuco bases of triphenyl methane dyes, such as 4-dimethylaminotriphenylmethane, 4',4',4"-tri-di-methylamino-triphenylmethane; leuco bases of xanthene dyes, such as 3,6-bis dimethylamino xanthene and 3,6-bis dimethylamino-9-(2-carboxyethyl) xanthene; polyethers, such as ethylene glycol diethyl ether, diethylene glycol, diethyl ether tetraethylene glycol dimethyl ether, and the like.

A second reducing agent that is also a humectant, exemplified by sorbitol, is used in one embodiment as a constituent of the treating solution, for the humectant, apparently by reason of a moisture conditioning effect on the "dry" coating prior to developing. It provides substantial aid in maintaining density of the metal coating on the internal material of the member during a developing step in which any unconverted radiation-sensitive composition in the coating is washed off of the base.

Among the suitable surfactants are polyethenoxy nonionic ethers, such as TRITON X-100, manufactured by Rohm & Haas Co., and nonionic surfactants based on the reaction between nonyl phenol and glycidol, such as Surfactants 6G and 10G manufactured by Olin Mathieson Company.

This treating solution, i.e., the radiation sensitive composition, contains an acidifying agent in the form of an acid salt for adjusting the pH of the aqueous solution to usually between about 2.0 and 4.0 (preferably 2.5 to 3.8) and a small quantity of halide ions (iodide, bromide or chloride ions), so that a combination of additives provides a surprising effect in substantially intensifying the density of the coating that is formed subsequently by exposure of the treated planar material to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoroboric acid, citric acid, lactic acid, phosphoric acid, sulfuric acid, acetic acid, formic acid, boric acid, hydrochloric acid, nitric acid and the like. A wide variety of bromide, chloride and iodide salt and other halide-generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are preferred, as they produce a higher degree of sensitivity (i.e., darker and denser deposits) on the substrate than the corresponding chloride in at least certain instances.

The halide ions constitute only a minor proportion of the solute and may typically range from about 0.045 to 1.6%, preferably about 0.13 to 0.45%, based on the total weight of dissolved solids. The amount of halogen may be stated otherwise as between about 0.9 and 25 milliequivalents of halogen per liter of the sensitizing solution, preferably about 2.5 to 9 milliequivalents, e.g., 0.3–1.0 gm/l for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1 and preferably about 4:1 to 100:1.

The radiation sensitive composition is applied to the material 170 to thoroughly wet the material defining the pores whereby the porous member is subjected to the radiation sensitive composition for a time sufficient for the composition to permeate or penetrate through the pores 180 of the material 170 and form a coating on the pore interior along the material defining the pores from one side of the porous planar material to the other. Thereafter the coating porous member is dried by air drying or oven baking at below 50° C. At this stage, to preserve the light-sensitive nature of the treating compositions, the material should be processed under yellow light conditions. The member should also be kept at a temperature less than 70° F. and at no greater than 60% relative humidity because of possible absorption of water by the material of the member which can adversely affect the process.

The surface of one side of the coated porous member is masked with an opaque cover 260 (FIG. 12) in selected areas so that subsequent radiation will not strike the covered area. The masking 260 can result in dot shaped conductive areas of any desired, shape, size, array or alternating bands or strips of conductive areas through the Z-axis direction, separated by alternating bands of nonconductive areas. The dots are conventionally circulator but could have other geometrical configurations, as squares, rectangles, etc. The size of the dot can be as small as a 0.0001 inches and as large as 0.025 inches, preferably 0.001 inches, 0.002 inches, 0.003 inches, 0.004 inches, 0.005 inches, 0.008 inches, 0.009 inches or fraction thereof where the pitch, defined as the distance between the centers of adjacent dots is preferably at least twice the dimension of the dots, e.g., 1 mil dot, 2 mil pitch.

The masked member 170 is exposed to radiation, such as light, electron beams, x-ray, and the like, preferably ultra-violet radiation, for a time and at a power sufficient to reduce the metallic cations in the metal salt to metal nuclei throughout the thickness of the member. The member 170 is then unmasked and washed with an acidic or alkaline washing solution to wash off the radiation sensitive composition that had been protected by the opaque cover. The acidic or alkaline washing (or fixing) solution does not affect the areas where the radiation had reduced the metal cations to metal nuclei, if the solution is not left in contact with the areas for more than a few minutes, e.g., 5 minutes or less.

Specifically, the treated member 170 is selectively masked with a metallic mask, diazo or silver halide film, as shown in FIG. 12. The masked member 170 is then photo imaged with either a non-collimated or collimated ultraviolet light source of less than 500 manometers wavelength. The catalyst, the nonconductive metal nuclei, itself requires a minimum of 200 millijoules radiant energy to establish a stable photo image.

The UV light energy is strong enough to penetrate through the thickness of the porous member. Thus, in subsequent plating operations, the conductive metal plates continuously through the Z-axis and provides electrical continuity in the Z-axis. If desired, the UV light energy can be applied to both sides of the planar member.

After a 5 minute normalization period, the catalyzed material is then washed for a short period of 30–90 seconds in a sulfuric acid solution, e.g., a solution consisting of 8% sulfuric acid by weight and 92% deionized water by weight or an alkaline solution consisting of 40 g/l of ethylene diamine tetraacetic acid, 100 ml/l of formaldehyde, adjusted at a pH of greater than 10 with sodium hydroxide. The purpose of this washing step is to eliminate the unexposed catalyst from the material while retaining the photo-reduced image.

The washed material containing the selective image is next stabilized with a reactive metal cation replacement solution. A convenient solution is:

| REACTIVE METAL CATION SOLUTION |
| --- |
| 0.25 gram/liter of palladium chloride |
| 8% sulfuric acid by weight |
| 92% D.I. water by weight |

The image undergoes a replacement reaction of the copper with more stable cation, e.g., palladium. A more stable system is desired because of tendency of the copper to oxidize at such thin layer amounts and because of the ability of the palladium to initiate the reduction reaction in the electroless both more rapidly. The member is kept in this solution at least 30 seconds, and is subsequently washed in D.I. water for about 1 minute.

The catalyzed member is selectively electrolessly plated with one or more conductive metals to a deposition thickness of about 50–60 micro inches. Such metals include copper, nickel, gold, silver, platinum, cobalt, palladium, rhodium, aluminum and chromium. During the time in the electrolyses baths, the member is agitated with a rocking motion to promote diffusion of the metal to the innermost region of the substrate. Plating is carried out by first rinsing in deionized water, then dipping in an agitated electroless copper bath for a time sufficient to deposit copper in the material over the palladium and through the substrate thickness.

Thus, within selected areas through the material in the Z-axis direction, the material nodes 190 and fibrils 200 are at least partially covered with a conductive metal layer 230, having a Z-axis portion 290 and upper and lower contact pads 270 and 280. The conductive metal forms a continuous path of conductivity 290 through the selected areas between upper and lower pads 270 and 280.

In the following examples, the catalytic treating solution used was prepared by adding to one liter of D.I. water:

| COMPONENT | AMOUNT (gms) | |
| --- | --- | --- |
| 2,6 di-sodium anthraquinone di-sulfonic salt | 30 | |
| 2,7 di-sodium anthraquinone di-sulfonic salt | | 30 |
| sorbitol | 220 | 220 |
| cupric acetate | 15 | 15 |
| cupric bromide | 0.5 | 0.5 |
| olin G-10 surfactant | 2 | 2 |
| fluoroboric acid | pH 3.5–3.8 | |

The fixing solution used was 8% sulfuric acid by weight, 92% distilled water by weight. A stabilizing solution is also used, and contains the following components.

| STABILIZING SOLUTION |
| --- |
| 0.25 g/l palladium chloride |
| 8% sulfuric acid by weight |
| 92% distilled water by weight |

EXAMPLE 9

As taught in the '467 patent, a stretched porous polytetrafluoroethylene membrane obtained from W. L. Gore & Associates was treated with a wetting agent by immersing it in a solution of 75% methanol, 25% ethanol and of 1 weight % copolymer of tetrafluoroethylene and vinyl alcohol at room temperature for about 30 seconds.

The wetted membrane was then dipped into the catalytic treating solution for 60 seconds and was then dried in an oven at 50° C. for 3 minutes. One surface of the membrane was then masked with dots of a diazo film of 6 mil diameters and 6 mil pitch (center to center).

The membrane was then exposed to a collimated UV light source at 1600 millijoule for about 2 minutes. After a 5 minute normalization period, the UV treated membrane was then washed for 30 seconds in the fixing solution to eliminate unexposed catalytic treating solution. The selectively imaged membrane was then stabilized by dipping into the stabilizing solution for one minute and then washing in distilled water for one minute.

The stabilized membrane was then dipped into a copper plating bath composition (Shipleys 3) on a per liter of D.I. water basis.

| PLATING SOLUTION |
| --- |
| 30 grams of ethylenediamine tetra acetic acid |
| 6 to 8 grams sodium hydroxide |
| 5 to 7 grams copper II sulfate |
| 2 to 3 grams formaldehyde |
| 2 grams of a given surfactant |

The membrane was agitated in the bath using an agitation bar for 7 ½ minutes to promote diffusion of copper throughout the pores of the membrane in the catalyzed portion throughout in the Z-axis.

The passageways of the conductive z-axis material can be filled with an adhesive to function as a connector interface between two other conductive materials. Suitable adhesives include epoxy resin, acrylic resin, urethane resin, silicone resin, polyimide resin, cyanate ester resin, or the like. The adhesive is conveniently imbibed into the pores by immersing the member in a solution of the adhesive. For an epoxy resin, a suitable solvent is methylethylketone. Once the adhesive is imbibed or impregnated into the conductive z-axis material, in order to provide bonding capability, it is baked at 160° C. to form a B-stage conductive z-axis member.

EXAMPLE 10

A 6 mil (150 micrometer) thick, stretched, porous polytetrafluoroethylene membrane was wetted by subjecting it to 2 propanol by dipping for 1 minute. It was then dipped into the catalytic treating solution for one minute, dried, masked and subjected to UV light as in Example 9. It was then subjected to the fixing and to the stabilizing solution as in Example 9 and subsequently plated with copper as in Example 9.

EXAMPLE 11

A 2 mil thick stretched porous polytetrafluoro-ethylene membrane was prepared as in Example 9 except that the masking strips were 3 mil pad with a 10 mil pitch.

EXAMPLES 12–14

The procedure of Example 9 was followed for membranes formed from porous polyethylene, porous poly-propylene and open cell, porous polyurethanes to produce a conductive z-axis material having irregularly shaped conductive pathways that extend along the z-axis.

EXAMPLE 15

Figure 15:
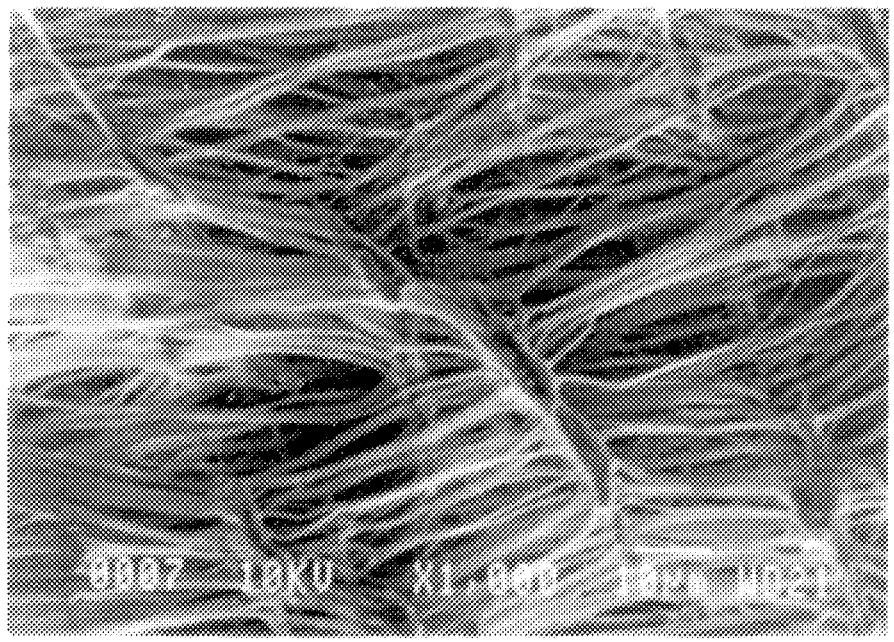
FIGS. 15–18 are scanning electronmicrographs showing the node fibril structure of some ePTFE matrix materials used to form a conductive Z-axis material.

A membrane formed from a stretched porous polytetrafluoroethylene membrane having the node-fibril structure shown in FIG. 15 (1000× magnification) is 76 μm thick with a density of 0.22 gm/cm³ and an air volume of 70% at 25° C., and is available from W. L. Gore & Associates, was prepared as in Example 9 to form a conductive z-axis membrane, except that the masking strips were 2 mil pad with a 5 mil pitch.

EXAMPLE 16

Figure 16:
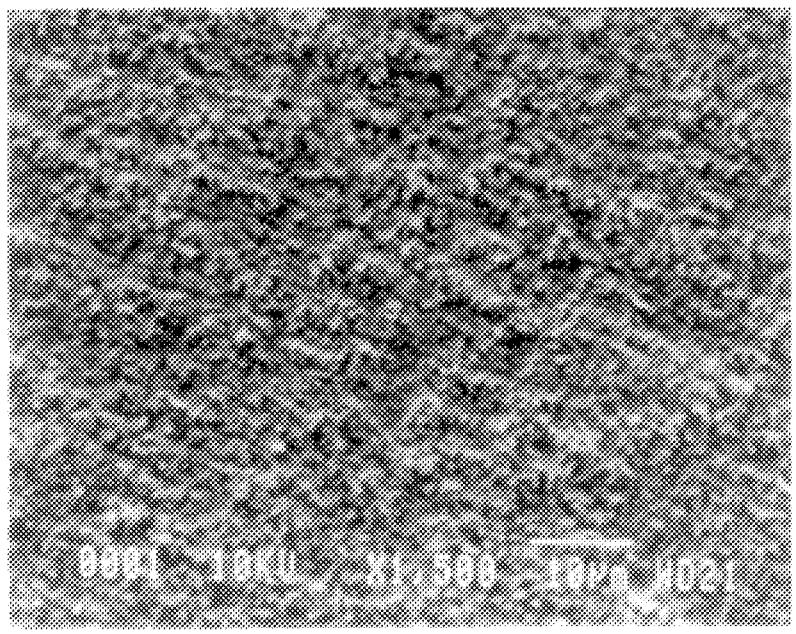

A stretched porous polytetrafluoroethylene membrane with the node-fibril structure shown in FIG. 16 (1500× magnification) that is 40 μm thick, with a density 0.4 gm/cm³ and an air volume of 20% at 25° C., available from W. L. Gore & Associates, was prepared as in Example 9 to form a conductive z-axis membrane, except that the masking strips were 8 mils with a 15 mil pitch.

EXAMPLE 17

Figure 17:
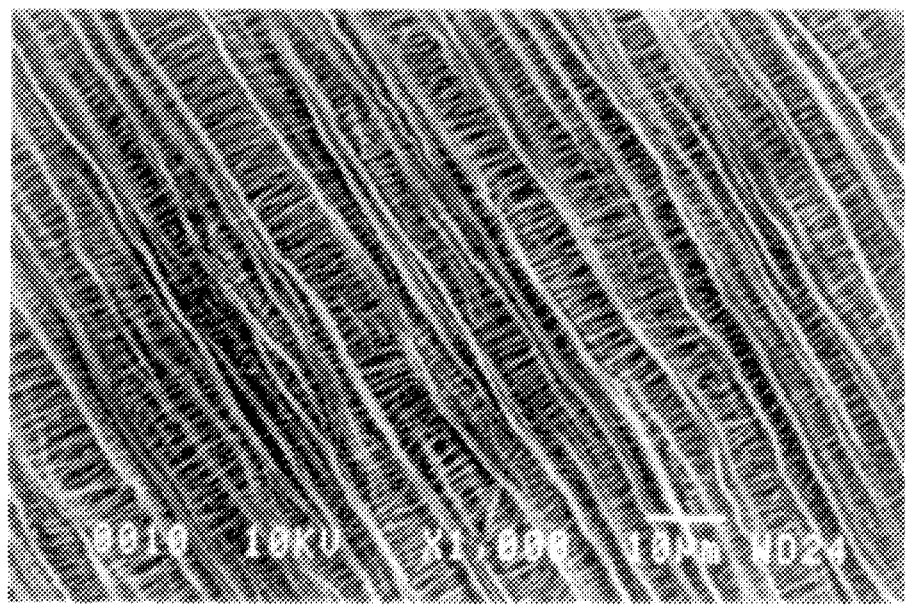

A stretched porous polytetrafluoroethylene membrane with the node-fibril structure of FIG. 17 (1000× magnification) that is 100 μm thick, with a density of 0.35 gm/cm³ and an air volume of 30% at 25° C., available from W. L. Gore & Associates, was prepared as in Example 9 to form a conductive z-axis membrane, except that the masking strips were 8 mils with a pitch of 15 mils.

EXAMPLE 18

Figure 18:
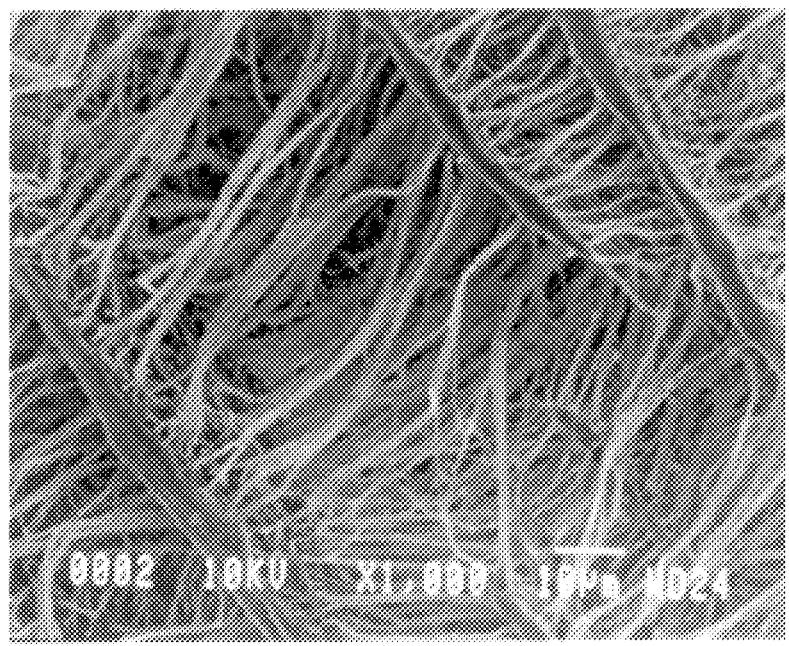

A stretched porous polytetrafluoroethylene membrane with the node-fibril structure of FIG. 18 (1000× magnification) is 150 μm thick, with a density of 0.20 gm/cm³ and an air volume of 70% at 25° C., and which is available from W. L. Gore & Associates, was prepared as in Example 1 to form a conductive z-axis membrane, except that the masking strips were 8 mils with a 15 mil pitch.

The conductive z-axis materials of Examples 10–18 containing conductive pathways described above can be filled with an adhesive to be a connector interface between two other conductive materials. Suitable adhesives include epoxy resin, acrylic resin, urethane resin, silicone resin, polyimide resin, cyanate ester resin, or the like. The adhesive is conveniently imbibed into the pores by immersing the member in a solution of the adhesive. For an epoxy resin, a suitable solvent is methylethylketone. As with Example 9, the z-axis material is impregnated with epoxy adhesive in order to provide bonding capability and baked at 160° C. to provide a B-stage z-axis composite. While particular embodiments of the present invention have been illustrated and described herein, the present invention is not limited to such illustrations and descriptions. It is apparent that changes and modifications may be incorporated and embodied as part of the present invention within the scope of the following claims.

We claim:
1. A high density chip package comprising:
a substrate having,
  A) a metal core having at least one clearance formed therethrough;
  B) at least one dielectric layer disposed on each of top and bottom surfaces of said metal core, said at least one dielectric layer being an expanded polytetrafluoroethylene material having an initial void volume and a mean flow pore size, said expanded polytetrafluoroethylene material having a mixture contain- ing particulate filler and an adhesive resin, the particulate filler being a collection of individual particles having an average particle size wherein a ratio of said mean flow pore size to the average particle size is greater than about 1.4, wherein said mixture is substantially evenly distributed throughout said void volume of said expanded polytetrafluoroethylene material:

C) at least one conductive layer disposed on each of said dielectric layers; and D) at least one conductive via electrically connecting said conductive layers;

said substrate adapted to electrically and mechanically mount a high density integrated circuit chip; and a high density integrated circuit chip electrically and mechanically mounted on said substrate.

2. A high density chip package comprising:

a substrate having,

A) a metal core having at least one clearance formed therethrough;

B) at least one dielectric layer disposed on each of top and bottom surfaces of said metal core, said at least one dielectric layer being an expanded polytetrafluoroethylene material having an initial void volume and a mean flow pore size, said expanded polytetrafluoroethylene material having a mixture containing particulate filler and an adhesive resin, the mixture being substantially evenly distributed throughout said void volume of said expanded polytetrafluoroethylene material, the particulate filler being a collection of individual particles, said collection containing a particle having a largest particle size which is the largest detectable particle in the collection, wherein a ratio of mean flow pore size to the largest particle size is at least about 2;

C) at least one conductive layer disposed on each of said dielectric layers; and D) at least one conductive via electrically connecting said conductive layers;

said substrate adapted to electrically and mechanically mount a high density integrated circuit chip; and a high density integrated circuit chip electrically and mechanically mounted on said substrate.

3. A high density chip package comprising:

a substrate having,

A) a metal core having at least one clearance formed therethrough;

B) at least one dielectric layer disposed on each of top and bottom surfaces of said metal core, said at least one dielectric layer being an expanded polytetrafluoroethylene material having an initial void volume and a minimum pore size, said expanded polytetrafluoroethylene material having a mixture containing particulate filler and an adhesive resin, the mixture being substantially evenly distributed throughout said void volume of said expanded polytetrafluoroethylene material, the particulate filler being a collection of individual particles, said collection containing a particle having a largest particle size which is the largest detectable particle in the collection, wherein a ratio of minimum pore size to the largest particle size is at least about 1.4;

C) at least one conductive layer disposed on each of said dielectric layers; and D) at least one conductive via electrically connecting said conductive layers;

said substrate adapted to electrically and mechanically mount a high density integrated circuit chip; and a high density integrated circuit chip electrically and mechanically mounted on said substrate.

4. A high density chip package according to claims 1, 2 or 3, wherein said metal core is copper.

5. A high density chip package according to claims 1, 2 or 3, wherein said metal core has a thickness of approximately 1.4 mils or less.

6. A high density chip package according to claims 1, 2 or 3 wherein said at least one dielectric layer is approximately 5 microns or more thick.

7. A high density chip package according to claims 1, 2 or 3, wherein said at least one dielectric layer has a thickness in a range from about 25 microns to about 50 microns.

8. A high density chip package according to claims 1, 2 or 3, wherein said adhesive resin is cyanate ester resin.

9. The high density chip package according to claims 1, 2 or 3, wherein said metal core is a nickel alloy containing from 30 wt. % to 42 wt. % nickel with laminated copper sheets on top and bottom surfaces thereof.

* * * * *